United States Patent
Preusse et al.

(10) Patent No.: US 7,375,031 B2
(45) Date of Patent: May 20, 2008

(54) TECHNIQUE FOR FORMING INTERCONNECT STRUCTURES WITH REDUCED ELECTRO AND STRESS MIGRATION AND/OR RESISTIVITY

(75) Inventors: Axel Preusse, Radebeul (DE); Markus Keil, Dresden (DE); Wolfgang Buchholtz, Radebeul (DE); Petra Hetzer, Dresden (DE); Elvira Buchholtz, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 245 days.

(21) Appl. No.: 11/292,537

(22) Filed: Dec. 2, 2005

(65) Prior Publication Data

US 2006/0246721 A1 Nov. 2, 2006

(30) Foreign Application Priority Data

Apr. 29, 2005 (DE) .................... 10 2005 020 061

(51) Int. Cl.
*H01L 21/44* (2006.01)
(52) U.S. Cl. .................... 438/660; 438/663; 438/687
(58) Field of Classification Search ............... 438/660, 438/661, 662, 663, 687
See application file for complete search history.

(56) References Cited

U.S. PATENT DOCUMENTS

| | | | |
|---|---|---|---|
| 4,758,533 A | 7/1988 | Magee et al. ............... 437/173 |
| 5,290,731 A | 3/1994 | Sugano et al. ............... 437/174 |
| 5,405,804 A * | 4/1995 | Yabe ........................... 438/662 |
| 6,391,777 B1 | 5/2002 | Chen et al. .................. 438/687 |
| 6,495,453 B1 | 12/2002 | Brongersma et al. ....... 438/660 |
| 6,727,176 B2 | 4/2004 | Ngo ............................ 438/660 |
| 6,743,310 B1 | 6/2004 | Ngo ............................ 148/525 |
| 6,835,657 B2 * | 12/2004 | Ong ............................ 438/662 |
| 2004/0104481 A1 | 6/2004 | Ong ............................ 257/758 |
| 2006/0005902 A1 * | 1/2006 | Barth et al. ................. 148/527 |

FOREIGN PATENT DOCUMENTS

DE    0 225 592 A2    6/1987
DE    102 17 876 A1    11/2003

OTHER PUBLICATIONS

PCT Search Report, PCT/US2006/011695, Mar. 8, 2006.
Official Communication from German Patent & Trademark Office dated Nov. 27, 2007.

* cited by examiner

*Primary Examiner*—Kevin M Picardat
(74) *Attorney, Agent, or Firm*—Williams, Morgan & Amerson

(57) ABSTRACT

By improving the purity of metal lines and the crystalline structure, the overall performance of metal lines, especially of highly scaled copper-based semiconductor devices, may be enhanced. The modification of the crystalline structure of the metal lines may be performed by a heat treatment generating locally restricted heating zones, which are scanned along the length direction of the metal lines, and/or a heat treatment comprising a heating step in a vacuum ambient followed by a heating step in a reducing ambient.

32 Claims, 4 Drawing Sheets

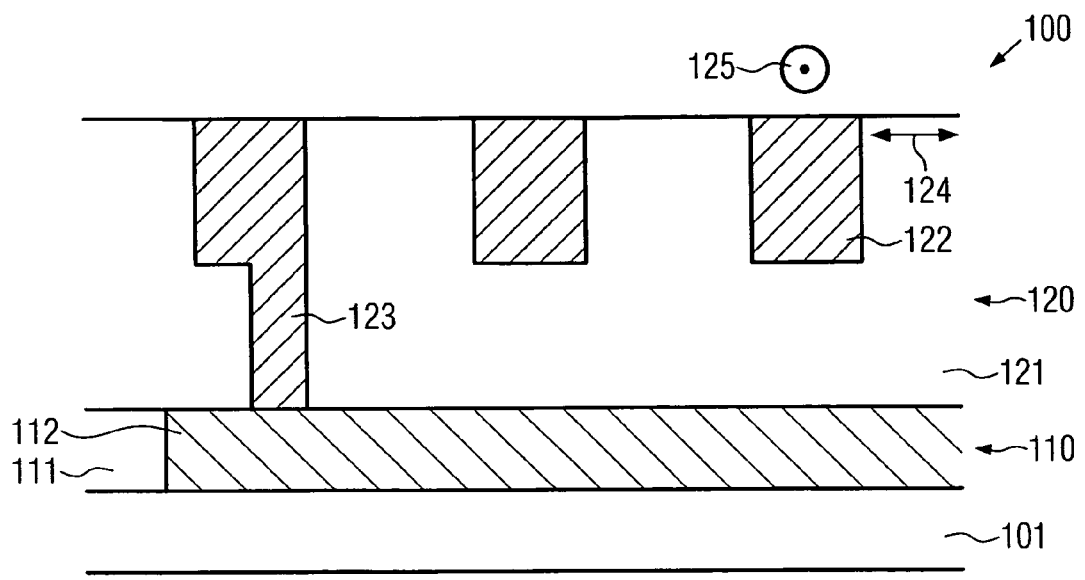
FIG. 1a
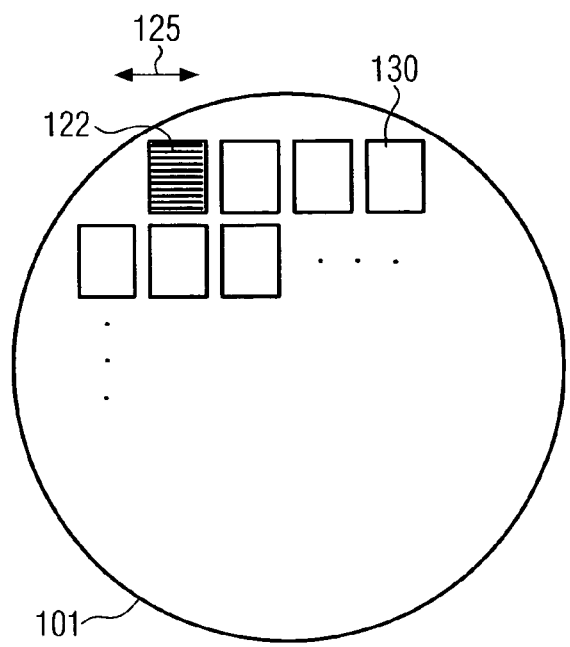
FIG. 1b
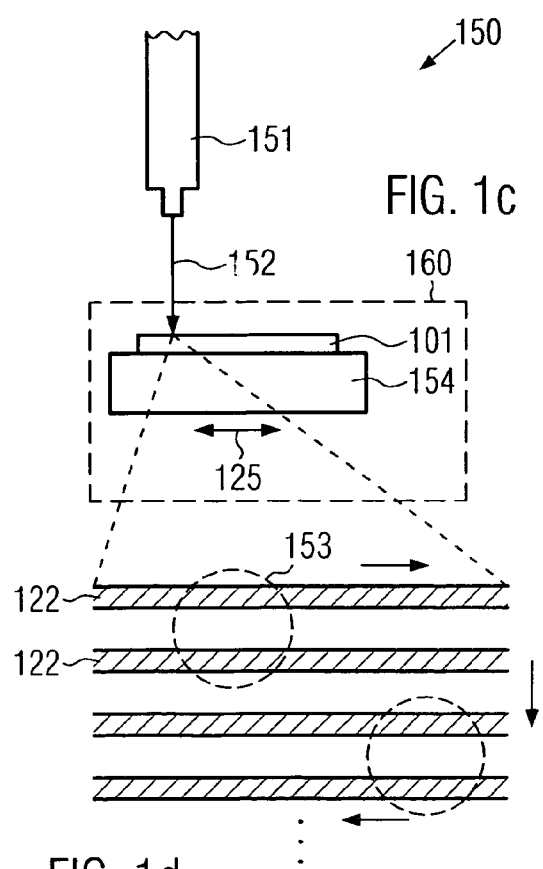
FIG. 1c
FIG. 1d

TECHNIQUE FOR FORMING INTERCONNECT STRUCTURES WITH REDUCED ELECTRO AND STRESS MIGRATION AND/OR RESISTIVITY

BACKGROUND OF THE INVENTION

1. Field of the Invention

Generally, the present invention relates to the formation of microstructures, such as advanced integrated circuits, and, more particularly, to the formation of conductive structures, such as metal lines in metallization layers of integrated circuits.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per unit die area. The reduced cross-sectional area of the interconnect lines, possibly in combination with an increase of the static power consumption of extremely scaled transistor elements, may require a plurality of stacked metallization layers to meet the requirements in view of a tolerable current density in the metal lines.

Advanced integrated circuits, including transistor elements having a critical dimension of 0.13 μm and even less, may, however, require significantly increased current densities in the individual interconnect lines despite the provision of a relatively large number of metallization layers, owing to the significant number of circuit elements per unit area. Operating the interconnect lines at elevated current densities, however, may entail a plurality of problems related to stress-induced line degradation, which may finally lead to a premature failure of the integrated circuit. One prominent phenomenon in this respect is the current-induced material transportation in metal lines, also referred to as "electromigration," which may lead to the formation of voids within and hillocks next to the metal line, thereby resulting in reduced performance and reliability or complete failure of the device. For instance, aluminum lines embedded into silicon dioxide and/or silicon nitride are frequently used as metal for metallization layers, wherein, as explained above, advanced integrated circuits having critical dimensions of 0.13 μm or less, may require significantly reduced cross-sectional areas of the metal lines and, thus, increased current densities, which may render aluminum less attractive for the formation of metallization layers, due to significant electromigration effects.

Consequently, aluminum is increasingly being replaced by copper which exhibits a significantly lower resistivity and exhibits an enhanced resistance to electromigration effects at higher current densities as compared to aluminum. The introduction of copper into the fabrication of microstructures and integrated circuits creates a plurality of severe problems due to copper's characteristic to readily diffuse in silicon dioxide and a plurality of low-k dielectric materials. To provide the necessary adhesion and to avoid the undesired diffusion of copper atoms into sensitive device regions, it is, therefore, usually necessary to provide a barrier layer between the copper and the dielectric material in which the copper lines are embedded. Although silicon nitride is a dielectric material that effectively prevents the diffusion of copper atoms, selecting silicon nitride as an interlayer dielectric material is less than desirable, since silicon nitride exhibits a moderately high permittivity, thereby increasing the parasitic capacitances of neighboring copper lines. Hence, a thin conductive barrier layer that also imparts the required mechanical stability to the copper is formed to separate the bulk copper from the surrounding dielectric material, and only a thin silicon nitride or silicon carbide or silicon carbonitride layer in the form of a capping layer is frequently used in copper-based metallization layers. Currently, tantalum, titanium, tungsten and their compounds with nitrogen and silicon and the like are preferred candidates for a conductive barrier layer, wherein the barrier layer may comprise two or more sub-layers of different composition so as to meet the requirements in terms of diffusion suppressing and adhesion properties.

Another characteristic of copper significantly distinguishing it from aluminum is the fact that copper may not readily be deposited in larger amounts by chemical and physical vapor deposition techniques. In addition, copper may not be efficiently patterned by anisotropic dry etch processes, thereby requiring a process strategy that is commonly referred to as the damascene or inlaid technique. In the damascene process, first, a dielectric layer is formed that is then patterned to include trenches and vias which are subsequently filled with copper, wherein, as previously noted, prior to filling in the copper, a conductive barrier layer is formed on the sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of approximately 0.1 μm or even less in combination with trenches having a width ranging from approximately 0.1 μm or less to several μm. Although electrochemical deposition processes for copper are well established in the field of electronic circuit board fabrication, a substantially void-free filling of high aspect ratio vias is an extremely complex and challenging task, wherein the characteristics of the finally obtained copper metal line significantly depend on process parameters, materials and geometry of the structure of interest. Since the geometry of interconnect structures is determined by the design requirements and may, therefore, not be significantly altered for a given microstructure, it is of great importance to estimate and control the impact of manufacturing processes involved in the fabrication of metallization layers and of materials, such as conductive and non-conductive barrier layers, of the copper microstructure and their mutual interaction on the characteristics of the interconnect structure so as to insure both high yield and the required product reliability.

Accordingly, a great deal of effort has been made in investigating the degradation of copper lines, especially in view of electro and stress migration and undue conductivity reduction in highly scaled devices, in order to find new materials and process strategies for forming copper-based metal lines, as increasingly tighter constraints are imposed with respect to the electro and stress migration and conductivity characteristics of copper lines with the continuous shrinkage of feature sizes in advanced devices. Although the exact mechanism of electro and stress migration in copper lines is still not quite fully understood, it turns out that voids positioned in and on sidewalls and interfaces, large bulk voids and residuals at the via bottom may have a significant impact on the electro and stress migration behavior. Empirical research results indicate that the degree of electro and stress migration may frequently depend on the material composition of the metal, the crystalline structure of the metal, the condition of any interfaces to neighboring materials, such as conductive and dielectric barrier layers, and the like.

For instance, in aluminum lines, grain boundaries provide preferred diffusion paths for stress- and current-induced material transport events. Consequently, as line size reduction tends to generate smaller grains, disproportionately increased electro and stress migration may occur. Although grain boundaries may not necessarily form preferred diffusion paths in copper-based metal lines, the increased number of grain boundaries may nevertheless significantly increase the overall resistivity of the copper-based line owing to increased electron scattering at the grain boundaries. Consequently, the highly complex manufacturing process of metallization layers, including the deposition of the metal, the subsequent annealing thereof and the like, needs to be controlled in an attempt to increase performance of the metal interconnect structures with respect to electro and stress migration and/or conductivity.

Therefore, a need exists for an enhanced technique that enables the formation of metal interconnect structures exhibiting reduced stress- and current-induced material diffusion and/or enhanced conductivity even in highly scaled microstructures.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique for forming metal lines in metallization layers of semiconductor devices, wherein the characteristics of the metal lines with respect to electro and stress migration and/or conductivity may be improved by applying a heat treatment during and/or after the formation of the metal lines so as to enhance the electrical performance of the metal lines. According to some illustrative embodiments, the heat treatment may at least include a heating process performed in a sub-atmospheric and/or vacuum and/or reducing and/or inert ambient so as to promote out-gassing of contaminants that have been introduced into the metal during preceding manufacturing processes. In other embodiments, the heat treatment comprises at least a heating process that is designed to vary a temperature created in the metal line along a predefined direction so as to locally generate heating zones moving along the predefined direction.

According to another illustrative embodiment of the present invention, a method comprises forming a metal line in a dielectric layer of a metallization layer of a semiconductor device, wherein the metal line extends along a length direction. Moreover, the method comprises performing a heat treatment to vary a temperature along the length direction in a timely sequential manner.

In accordance with still another illustrative embodiment of the present invention, a method comprises forming a metal line in a dielectric layer formed above a substrate comprising a semiconductor device and performing a heat treatment to modify a crystalline structure of the metal line. Additionally, the method comprises exposing the metal line to a vacuum ambient to promote out-gassing of contaminants in the metal line.

In one illustrative embodiment of the present invention, the metal line is exposed to a reducing ambient after exposure to the vacuum ambient. In this respect, a vacuum ambient is to be understood as an atmosphere with a reduced pressure on the order of magnitude of several Torr and significantly beyond, whereas a sub-atmospheric ambient may include pressure conditions that range from values below but close to the environmental pressure of the manufacturing facility to vacuum pressure conditions.

BRIEF DESCRIPTION OF THE DRAWINGS

The invention may be understood by reference to the following description taken in conjunction with the accompanying drawings, in which like reference numerals identify like elements, and in which:

FIG. 1a schematically illustrates a semiconductor device including a metallization layer containing a plurality of metal lines, the characteristics of which with respect to electro and stress migration and/or conductivity are to be enhanced in accordance with illustrative embodiments of the present invention;

FIG. 1b schematically shows a plan view of a substrate including a plurality of die areas, which in turn include a semiconductor device as shown in FIG. 1a;

FIGS. 1c and 1d schematically illustrate a heat treatment, in which a temperature of metal lines varies along a length direction in a timely sequential manner in accordance with illustrated embodiments of the present invention;

Figure 1E:
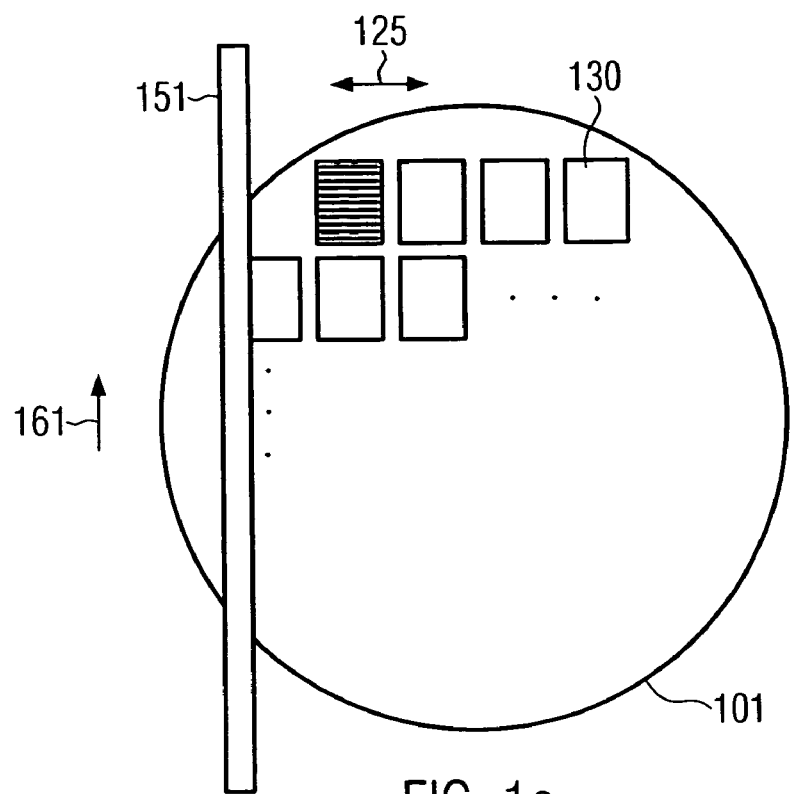
FIG. 1e schematically illustrates a heating process with a timely varying temperature along a length direction, which may be performed on a substrate basis according to illustrative embodiments.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is directed to a technique that enables the formation of metal lines in metallization layers of even highly scaled semiconductor devices, wherein a crystalline structure of the metals and/or the degree of purity of the metal is modified by means of a heat treatment to enhance the characteristics of the metal lines with respect to the resistance to electro and stress migration and/or their inherent conductivity. Without intending to restrict the present invention to the following explanation, it is believed that the reduction of the number of grain boundaries within a metal line may significantly affect the electrical performance of the metal line in that electro and stress migration is reduced and/or the inherent conductivity is increased. As is well known, the crystallinity of metals in metal lines of microstructures may significantly depend on the type of material used, the deposition technique used, the process parameters maintained throughout the deposition process, as well as any preceding and subsequent processes of the actual deposition of the metal.

For instance, copper-based metallization layers are presently formed by using electrochemical deposition techniques, such as electroplating, wherein the grain size and the crystalline structure significantly depend on the deposition parameters and on the dimensions of the trenches and vias to be filled with the copper-based metal, since reduced dimensions of the trenches and vias may result in the formation of metal grains of reduced dimensions. Hence, the inherent conductivity of the copper-based metal may be reduced owing to increased charge carrier scattering at the increased number of grain boundaries.

Moreover, as is well known, the electrochemical deposition into extremely scaled trenches and vias in a substantially void-free manner requires sophisticated electroplating techniques that involve highly complex electrolyte solution. Thus, a plurality of additives, such as deposition suppressors, accelerators, complexing agents and the like, are contained in typical electrolyte solutions, which may remain to a certain degree in the metal as deposited, thereby also compromising the resulting inherent conductivity of the metal line. Furthermore, the presence of contaminants within the metal and/or the existence of a plurality of grain boundaries may also have an influence on the electro and stress migration behavior, since grain boundaries and/or the contaminants may affect the characteristics of any interfaces between the metal and adjacent materials, such as any diffusion barriers for copper. Moreover, the grain boundaries may directly influence the stress-induced material transport as is, for instance, the case for aluminum. Consequently, by modifying the crystallinity of the metal and/or by reducing the amount of contaminants, the overall characteristics of the metal lines may be improved.

It should be appreciated that the present invention is particularly advantageous in the context of copper-based metallization layers, since these structures are typically manufactured by the damascene process using electrochemical deposition techniques, thereby generating a large number of small grains and incorporating contaminants of the electrolyte. However, the present invention may also be applied to metal lines formed of any other appropriate materials, such as aluminum, and, thus, the present invention should not be considered as restricted to copper-based metallization layers, unless such restrictions are explicitly set forth in the appended claims.

With reference to FIGS. 1a-1f and 2a-2d, further illustrative embodiments of the present invention will now be described in more detail. FIG. 1a schematically shows a semiconductor device 100 comprising a substrate 101, which may have formed therein any features of microstructures, such as circuit elements of integrated circuits. The substrate 101 may represent any appropriate substrate for forming microstructures such as semiconductor devices. For instance, the substrate 101 may represent a silicon-based substrate in the form of a bulk silicon substrate or a silicon-on-insulator (SOI) substrate, as the vast majority of complex integrated circuits, such as microprocessors, storage chips, ASICs and the like, are presently manufactured on the basis of silicon. It should be appreciated, however, that any other appropriate semiconductor materials, such as silicon-based materials including semiconductor regions of different composition, such as silicon germanium, silicon carbon and the like, different crystallographic orientations, different inherent strain, or substrates including any compound semiconductor materials, such as II-VI semiconductors, III-V semiconductors and the like, may also be used.

The semiconductor device 100 may have formed above the substrate 101 one or more metallization layers, wherein, in the exemplary embodiments shown, two metallization layers 110 and 120 are formed as a layer stack. The metallization layer 110 may comprise a dielectric layer 111 and a metal line 112, which is formed in the dielectric layer 111. Similarly, the metallization layer 120 may comprise a plurality of metal lines 122 formed within a dielectric layer 121, wherein one or more of the metal lines 122 may be connected to the underlying metallization layer 110 by a via 123. The metal lines 122 and 112 may be comprised of any appropriate metal and may comprise, in one particular embodiment, copper, wherein additional components may, at least locally, be provided in the metal lines 122 and/or 112 so as to form a metal alloy. For instance, it has been found that the presence of a copper alloy may enhance the characteristics of a respective metal line in view of its resistance against electro and stress migration. Moreover, when the layers 120 and 110 are to represent copper-based metallization layers, appropriate barrier layers may be provided to prevent undue diffusion of copper into the adjacent dielectric materials of the layers 111 and 121. For convenience, any such barrier layers are not shown in FIG. 1a and may be described in more detail with reference to FIG. 2a later on.

The metal lines 122 in the layer 120 may define a width direction 124, which may characterize the lateral dimension of the metal lines 122. Similarly, a length direction 125 may be defined by the metal lines 122, which is substantially perpendicular to the width direction 124 and is perpendicular to the drawing plane of FIG. 1a. It should be appreciated that, in advanced integrated circuits, such as highly complex microprocessors, a plurality of metallization layers, such as the layers 110 and 120, are stacked on top of each other, wherein, in each metallization layer, the respective metal lines extend substantially in a parallel fashion, whereas respective metal lines in an adjacent metallization layer also extend in parallel but substantially perpendicularly to the length direction of the latter metallization layer. In this way, any parasitic capacitances between metal lines of neighboring metallization layers are minimized. According to such an arrangement, the metallization layer 110 may have the metal lines 112 extending in a substantially parallel manner along the "width" direction 124 so as to reduce the capacitive coupling between the lines 122 and 112. It should be appreciated that such an arrangement may be advantageous with respect to the overall performance and, as will be described later on with respect to the heat treatment for modifying the crystalline structure, a specific length direction is defined individually for each metallization layer 110, 120. In other embodiments, some or all of the metal lines 112 and 122 may define their own specific width direction 124 and length direction 125 so that a corresponding "directional" heat treatment may be performed on an individual basis.

FIG. 1b schematically shows a plan view of the substrate 101 including a plurality of die regions 130, each of which may include a semiconductor device, such as the semiconductor device 100 of FIG. 1a. Moreover, the die regions 130 are shown so as to expose the metallization layer 120, wherein the length direction 125 of the metal line 122 is now oriented horizontally. However, the orientation of the metal line 122 in the drawings is of illustrative nature only and thus the length direction 125 defines the scan direction. It should further be appreciated that the dimensions of the die regions 130 with respect to the substrate dimension and, in particular, the dimensions of the metal line 122, are significantly magnified.

The semiconductor device 100 may be formed in accordance with well-established processes, which may be described for embodiments referring to a damascene technique with reference to FIG. 2a later on. In other embodiments, when the metallization layers 110 and 120 are aluminum-based metallization layers, the metal lines 112 and 122 may be formed by depositing aluminum on the basis of well-approved deposition techniques, such as chemical vapor deposition, sputter deposition and the like. Thereafter, the metal layer may be patterned by means of photolithography and well-established etch techniques, thereby forming the metal lines 112 and 122, as well as the via 123. Thereafter, a heat treatment may be performed to modify the crystalline structure of the metal lines 112, 122 as will be described in the following, or, according to other embodiments, the respective metal lines 112 and 122 may be embedded into the respective dielectric layers 111, 121 by depositing an appropriate dielectric material and planarizing the resulting topography.

Irrespective of the process sequence for forming the metal lines 112, 122, illustrative embodiments for modifying the crystalline structure of the metal lines 122 and/or their amount of contaminants will now be described in more detail.

FIG. 1c schematically shows a system 150 configured to perform a heat treatment on the metal lines 122 to vary a temperature during the heat treatment along the length direction 125 in a timely sequential manner. For this purpose, the system 150 may comprise a heating source 151, which is configured to establish a locally restricted heating zone on or in the substrate 101. In one illustrative embodiment, the heating source 151 may comprise a source for establishing a beam of radiation or a beam of particles to produce a locally restricted beam spot 153 on or in the substrate 101, wherein the beam spot 153 may represent an example of the locally restricted heating zone. In one particular embodiment, the beam 152 may represent a laser beam of specified characteristics, such as wavelength, intensity and the like, to produce the required heat in the locally restricted heating zone 153. The heating source 151 may comprise any additional means (not shown) required for forming the beam 152 to exhibit the desired characteristics. For example, corresponding beam optics, such as mirrors, lenses and the like, may be provided to focus and direct the beam 152 onto a locally restricted area of the substrate 101. Moreover, the system 150 is configured to establish a relative motion between the substrate 101 and the heating source 151 to enable a scanning motion of the locally restricted zone 153 at least along the length direction 125. For instance, the system 150 may comprise a moveable substrate holder 154, which is at least moveable along the length direction 125. In other cases, the substrate holder 154 may also be moveable in other directions, such as in a further lateral direction perpendicularly to the length direction 125, and may also be movable vertically, that is, along the direction of the beam 152.

During operation of the system 150, the substrate 101 may appropriately be positioned on the substrate holder 154 to allow a relative motion substantially along the length direction 125 of at least one of the metal lines 122. If the metal lines 122 are provided as substantially parallel lines, the length direction 125 may be defined commonly for all of the metal lines 122.

FIG. 1d schematically shows an enlarged view of a portion of the metallization layer 120 with a plurality of metal lines 122 exposed to the heating source 151. In the exemplary embodiment shown, the beam 152 generates the locally restricted beam spot or heating zone 153, which in turn covers a portion of one or more of the metal lines 122. In this case, the beam spot 153 defines the locally restricted heating zone created by the heating source 151. It is to be noted that the intensity profile within the heating zone 153 may not necessarily be uniform. Thus, the intensity and thus temperature profile caused in the lines 122 may locally vary within the heating zone 153, depending on the scan speed, spot size and overall intensity of the beam, absorption characteristics and the like. The heating source 151 may be dimensioned such that a temperature within the beam spot 153 and, thus, within the locally restricted heating zone exceeds a specified target temperature which enables a reconfiguration of the crystalline structure within the portion of the metal line 122 that is affected by the beam spot 153.

It should be appreciated that typically the energy deposited by the heating source 151 within the locally restricted heating zone 153 may be dimensioned such that the target temperature within the zone 153 is reached within a time interval that does not allow significant heat transportation within the metal line 122. Consequently, portions adjacent to the heating zone 153 of the metal line 122 are significantly colder and may substantially maintain their current crystalline structure. Hence, by establishing a relative motion between the substrate 101 and the heating source 151, the heating zone 153 may be scanned along the length direction 125 and, therefore, sequentially heat portions of the line 122, thereby enabling the currently heated portion to take on a crystalline structure similarly to a crystalline structure generated in that portion that was heated before and that is now cooled down below the target temperature so as to "freeze" the crystalline structure obtained immediately before. In this way, the size of the grains within the metal lines 122 may be increased in the length direction 125, thereby significantly reducing the number of grain boundaries per unit length. For instance, in copper-based metal lines, a grain size in the length direction 125 of 10 μm or even more may be achieved.

In some embodiments, the extension of the locally restricted heating zone 153 in the length direction 125 may be selected to be a few micrometers or even less so as to enable an efficient reconfiguration as the zone size is less than the desired grain size. The scanning motion may be performed in a substantially continuous fashion, for instance by continuously moving the substrate holder 154 according to a specified speed, or, in other embodiments, a substantially stepwise motion may be created, wherein the dwell time after every step as well as the step size may be adjusted so as to obtain a desired degree of overlap between the "moving" heating zone 153. Depending on the lateral extension of the locally restricted heating zone 153, that is, in FIG. 1d, the vertical dimension, a corresponding motion in the lateral direction may be performed after one or more metal lines 122 are heat treated in the above described manner. In some embodiments, it may be advantageous to keep the temperature "stress" for the dielectric material surrounding the metal lines 122 at a low level. In this case, the scan operation along the length direction 125 may be repeated once or several times with a moderate temperature created within the heating zone 153. For instance, a typical effective temperature of the heating zone may be selected to be approximately 100-400° C.

In one illustrative embodiment, the heat treatment with a scanned locally restricted heating zone as represented, for instance, by the beam spot 153, may be, at least partially, performed in a sub-atmospheric ambient or a vacuum ambient to simultaneously promote the out-gassing of any contaminants contained in the metal lines 122. For this purpose, at least the substrate holder 154 may be placed in a respective process chamber 160, which enables the establishment of an appropriate ambient and which especially allows a provision of a sub-atmospheric ambient and, in one illustrative embodiment, a vacuum ambient. In these embodiments, the heating source 151 may be attached to the process chamber 160 or may be coupled to the process chamber 160 in such a way that the beam 152 may be introduced without undue losses. In other cases, the heating source 151 may be placed, at least partially, within the respective process chamber 160. In some embodiments, the substrate 101 may be pre-heated in the sub-atmospheric or vacuum ambient so as to further promote the out-gassing during the entire directional heating of all of the metal lines 122 and/or to maintain the metal lines 122 at an elevated temperature, thereby relaxing the constraints for the heating source 151 for raising the metal lines 122 exposed to the moving heating zone 153 above the target temperature.

In still other embodiments, the heat treatment may comprise a further step, in which the metal lines 122 are exposed to a reducing gas ambient to thereby provide a substantially non-oxidized metal surface of the metal lines 122. For this purpose, a forming gas or other hydrogen mixture with inert gases, such as argon, xenon, krypton and the like, may be introduced into the process chamber 160, wherein the pressure may range from sub-atmospheric conditions to atmospheric or elevated pressure conditions. The heat treatment on the basis of a reducing ambient may be performed simultaneously with the directional zone heating or may be performed after the zone heating process step. For example, a first heat treatment step may be performed in a vacuum ambient, while, in one illustrative embodiment, the metal lines 122 are subjected to the directional zone heating, whereas, in other embodiments, a non-directional heating step may be performed prior to the zone heating and the vacuum ambient may be maintained during a subsequent zone heating. Thereafter, a second heat treatment, which may include a non-directional and/or a directional heating step, may be performed in the reducing ambient to enhance the purity of the metal of the lines 122.

FIG. 1e schematically shows the substrate 101 in a plan view, wherein the heating source 151 or at least a portion thereof is configured to enable the timely sequential or directional heat treatment on an extended "vertical" portion of the substrate 101 or which enables the creation of the locally restricted heating zone 153 across the entire substrate 101 in the non-scan direction, that is, in FIG. 1e, the vertical direction indicated by arrow 161. To this end, the heating source 151 may comprise an appropriate beam optics (not shown) to shape the beam 152 in a longitudinal shape in the vertical direction. For example, the heating source 151 may comprise a plurality of optical fibers (not shown) that are vertically arranged to provide a plurality of closely spaced laser beams on the substrate 101. Moreover, the provision of a plurality of optical fibers also allows the employment of two or more individual laser sources, if the required energy for scanning substrates with large diameters, such as 200 mm or 300 mm substrates, may not be provided by a single laser. Moreover, an appropriate focusing element, such as a lens, may be provided at the end of each optical fiber to produce a desired highly focused laser beam. On the other hand, respective optical couplers may be used for efficiently coupling the laser beam and dividing the same into a plurality of optical fibers.

Figure 1F:
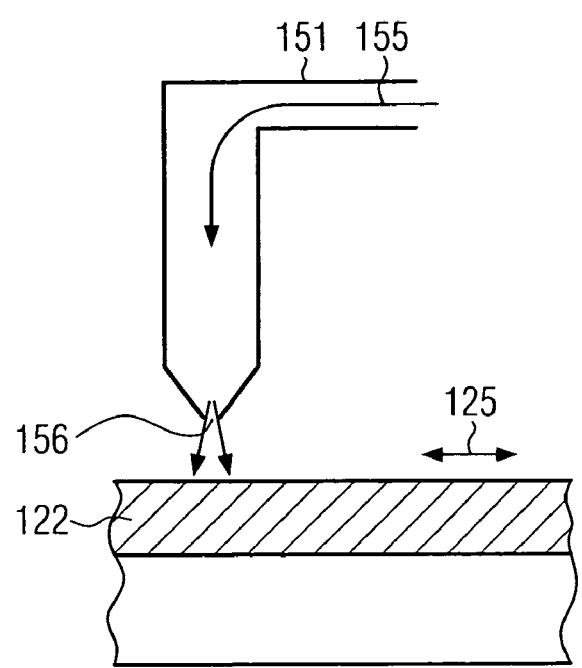
FIG. 1f schematically shows the heat treatment of FIG. 1e, wherein a heat transfer medium may be used in accordance with further illustrative embodiments.

FIG. 1f schematically shows the heating source 151 of FIG. 1e according to a further illustrative embodiment in a cross-sectional view. In this embodiment, the heating source 151 may also extend significantly in the lateral direction, i.e., the vertical direction in FIG. 1e or the direction perpendicular to the drawing plane of FIG. 1f, wherein heat is transferred to the plurality of metal lines 122 via a heat transfer medium 155. The heat transfer medium 155 may be provided in the form of a hot gas, such as hot nitrogen, or any other appropriate substantially inert gas. In other embodiments, the heat transfer medium 155 may be provided in the form of vapor of an appropriate fluid having a condensation temperature that is at or above the target temperature for locally heating the metal lines 122. Consequently, in this embodiment, when provided onto the metal lines 122, the heat transfer medium 155 may contact or condense on the metal lines 122, thereby locally transferring heat in a highly efficient manner due to the direct contact to the metal line 122 and the additional creation of latent heat. For supplying the heat transfer medium 155 onto the metal lines 122, the heating source 151 may comprise a plurality of individual nozzles 156 or may comprise one or more elongated nozzle channels extending laterally with respect to the length direction 125 so as to form a nozzle bar or nozzle "gap" in the non-scan direction (in FIG. 1e, the vertical direction). For example, a single lateral gap may be provided as an elongated nozzle, thereby enabling the simultaneous treatment of a plurality of metal lines 122, depending on the lateral extension of the elongated nozzle. The one or more nozzles 156 may be configured to supply the heat transfer medium 155 in a highly localized manner along the length direction 125 in that the nozzle opening may have a size of approximately 1 μm and the distance to the metal line is kept within a range of approximately several μm. In other embodiments, the heat transfer medium 155 may be provided in the form of a liquid, which may solidify after cooling down. For instance, a melted polymer material may be "deposited" in a directional manner to provide the locally restricted heating zone 153. After the heat treatment, the polymer material may be removed by well-established etch procedures.

In still other embodiments, the heating source may transfer heat by radiation. In this case, the heating source 151 may comprise a heater element that is elongated in the non-scan direction, but restricted in size in the scan or length direction 125. For example, the heater element may comprises a conductor, such as a wire that is connected to a corresponding power supply for heating the wire by initiating a current flow therein. Moreover, the wire may be incorporated into an appropriate focusing system that may direct the heat radiation onto the metal lines 122, thereby forming a focus line extending along the non-scan direction.

During operation of the heating source 151 as shown in FIGS. 1e and 1f, a scan operation with continuous or stepwise motion may be performed once, twice or several times, depending upon process and device requirements. Hereby, a distance between the heating source 151 and metal lines 122 may be varied so as to adjust the effective temperature of the moving heating zone 153. Moreover, the effective temperature may alternatively or additionally be adjusted by controlling the effective scan "speed," irrespective of whether a continuous or a stepwise motion is employed.

Figure 2A:
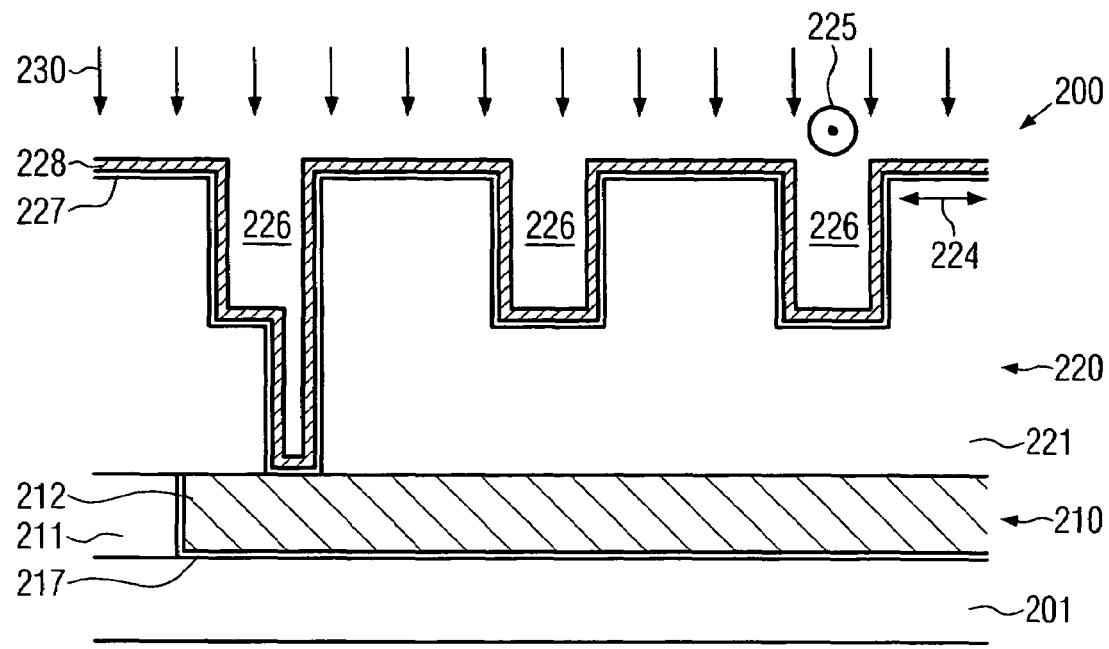
FIG. 2a schematically illustrates a semiconductor device including a metallization layer formed in accordance with a damascene process during an intermediate manufacturing stage, in which the semiconductor device is subjected to a heat treatment according to illustrative embodiments of the present invention.

With reference to FIGS. 2a-2d, further illustrative embodiments of the present invention will now be described in more detail. FIG. 2a schematically shows, in a cross-sectional view, a semiconductor device 200 comprising a substrate 201 having formed thereon one or more metallization layers 210, 220. Regarding the characteristics of the substrate 201, the same criteria apply as previously explained with reference to the substrate 101. At least one of the metallization layers 210, 220 may represent a copper-based metallization layer of a highly scaled semiconductor device. Thus, the metallization layer 210 may comprise a dielectric layer 211, which may be formed of any appropriate material, such as a low-k dielectric material and the like, and may comprise a metal line 212 comprising copper and/or any alloy thereof, wherein the metal line 212 may be separated from the dielectric layer 211 and the underlying substrate 201 by an appropriate barrier layer 217. Similarly, the metallization layer 220 may comprise a dielectric layer 221, formed by any appropriate material, such as a low-k dielectric material and the like. The dielectric layer 221 comprises a plurality of trenches 226 having a lateral dimension in a width direction 224, which may be on the order of magnitude of several micrometers to 100 nm and even less in sophisticated devices. Moreover, the trenches 226 define a length direction 225, which is substantially perpendicular to the lateral direction 224. Exposed surfaces of the dielectric layer 221 and the trenches 226 are covered by a barrier layer 227 on which is formed a seed layer 228. The seed layer 228 may be comprised of copper or any other appropriate material that promotes the deposition of metal within the trenches 226 in a subsequent electrochemical deposition process. In one illustrative embodiment, the seed layer 228 is comprised of substantially the same material as will be deposited in the subsequent electrochemical deposition.

The device 200 as shown in FIG. 2a may be formed by the following processes. After the formation of any circuit elements in and on the substrate 201, the metallization layer 210 may be formed in accordance with process strategies as will be explained with the formation of the layer 220. That is, an appropriate dielectric material is deposited, for instance, on the basis of well-established chemical vapor deposition (CVD) techniques and/or spin-on techniques followed by advanced photolithography and etch techniques to form the trenches 226 in the dielectric layer 221. As previously explained, in advanced integrated circuits requiring extremely high operating speeds, the trenches 226 formed in the metallization layer 220 are substantially parallel to each other along the length direction 225, while for instance the metal lines 212 may also be parallel to each other but oriented along the direction 224. After patterning the dielectric layer 220, the barrier layer 227 may be formed by well-established sputter deposition techniques, atomic layer deposition (ALD), CVD and the like. Thereafter, the seed layer 228 may be formed by, for instance, sputter deposition or electroless plating and the like. In one particular embodiment, a copper-based material may be deposited as the seed layer 228.

Thereafter, the device 200 may be subjected to a heat treatment, indicated by 230, wherein the heat treatment 230 is performed in a similar fashion as is described with reference to FIGS. 1a-1f. In other words, the heat treatment 230 may be performed to heat at least the seed layer 228 in a locally restricted manner, i.e., by creating a heating zone as is described with reference to FIGS. 1c-1f, while scanning along the length direction 225. Hence, by means of the heat treatment 230, a crystalline structure of the seed layer 228 may be modified to reduce the number of grain boundaries by providing an enhanced crystalline structure for the subsequent electrochemical deposition of the bulk metal. The heat treatment 230 may be performed in a substantially inert ambient or a reducing ambient so as to effectively suppress corrosion and discoloration of the seed layer 228.

Figure 2B:
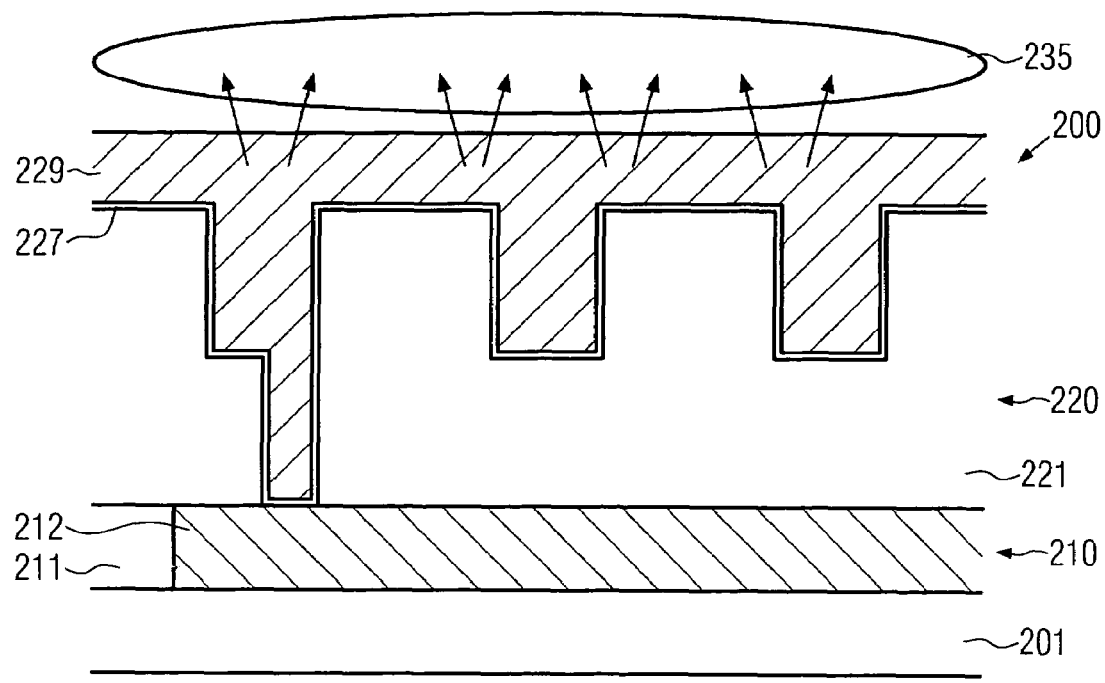
FIGS. 2b-2d schematically show the semiconductor device in further advanced manufacturing stages in accordance with various illustrative embodiments of the present invention.

FIG. 2b schematically shows the semiconductor device 200 in a further advanced manufacturing stage. The device 200 comprises metal 229 filled in the trenches 226, wherein excess metal forms a substantially closed layer above the metallization layer 220. The metal 229 may be comprised of copper and/or copper alloy, including components such as gold, nickel, palladium and the like. The metal 229 may be formed by electroplating, wherein, based on a complex electrolyte, a substantially void-free filling of the trenches 226 may be achieved. During the deposition process, contaminants in the form of accelerators, suppressors, complexing agents and the like may be incorporated into the metal 229 and would compromise the performance of the metal 229 during operation of the device 200. Thus, in one illustrative embodiment, the device 200 as shown in FIG. 2b is subjected to a heat treatment in an inert or sub-atmospheric or vacuum ambient 235 to promote out-gassing of contaminants contained in the metal layer 229. Moreover, in some embodiments, the heat treatment in the ambient 235 may be designed to also preheat the substrate 201 to a specified temperature to enhance the efficiency of a subsequent heat treatment for modifying the crystalline structure of the metal 229, that is, the substrate 201 may be heated to a temperature below the target temperature for a heat treatment for modifying the crystalline structure. In other embodiments, additionally or alternatively to the preheating process and in addition or alternatively to providing the sub-atmospheric or vacuum ambient 235, the device 200 may be subjected to a heat treatment to create locally restricted heating zones along the length direction 225, as is also described with respect to FIGS. 1c-1f. In some of these embodiments, the directional heat treatment may be performed after a certain amount of metal is filled in the lines 122. In this case, the fill process may be interrupted to perform the directional heat treatment in any appropriate manner as described above. Thereafter, the fill process may be resumed. Thus, the crystallinity of the metal in the partially filled metal lines 122 may be improved during the fill process and also the out-gassing of contaminants may be enhanced. In some embodiments, such an intermediate directional heat treatment may be performed more than one time to enhance the overall efficiency. Hereby, a directional heat treatment may or may not be performed immediately after completion of the seed layer 228.

Consequently, the crystalline structure of the metal layer 229 may efficiently be modified to reduce the number of grain boundaries as is also previously described. When the previously performed heat treatment 230 (FIG. 2a) is combined with an additional heat treatment scanned along the length direction 225, the overall efficiency may significantly be enhanced, since the electrochemical deposition of the metal 229 on the basis of the directionally heat-treated seed layer 228 may already provide an enhanced crystalline structure, which may then be improved even more efficiently.

According to other illustrative embodiments, the heat treatment 230 and/or the treatment within the ambient 235 and/or the heat treatment scanned along the length direction 225 on the basis of the metal layer 229 may be omitted, and the substrate 200 as shown in FIG. 2b may be subjected to a process for removing any excess metal of the layer 229. For this purpose, an electrochemical removal process and/or a chemical mechanical polishing (CMP) process may be performed to remove the excess metal and the barrier layer 227 on horizontal surfaces of the layer 220. Thereafter, the ambient 235 may be established and contaminants may be driven out of the corresponding metal lines. Moreover, at this manufacturing stage, in one embodiment, the heat treatment may be performed to sequentially heat restricted portions of the metal lines along the length direction 225 as is described previously with reference to FIGS. 1c-1f. Hereby, the heat treatment may be performed within the ambient 235 to simultaneously promote the out-gassing of contaminants, wherein a pre-heating may also be performed to maintain the substrate 201 at a specified elevated temperature throughout the entire directional heat treatment.

In still other embodiments, during the filling in of metal into the lines 222 or after the formation of the metal lines 222, a heat treatment may be performed, in which the device 200 is exposed to the vacuum ambient 235 for a specified time period and is then exposed to a reducing ambient with an appropriate gas mixture as specified above to further enhance the purity of the metal lines 222. In some embodiments, the heat treatment including at least one step with the vacuum ambient 235 and a further step with a reducing ambient may be combined with a directional zone heating as also described above with reference to FIGS. 1a-1f and FIG. 2a, whereas, in other embodiments, the zone heating may be omitted, when the improvement in conductivity due to an enhanced purity of the metal lines is considered sufficient.

In other embodiments, the dielectric layer 221 may be comprised of a low-k material, such as SiCOH, MSQ, HSQ, SiLK and the like, which inherently exhibits a reduced mechanical stability after formation compared to well-approved dielectrics, such as silicon dioxide, fluorine-doped silicon dioxide, silicon nitride and the like. By heat-treating the metal lines 222, the dielectric layer 221 may also be treated, at least in the vicinity of the metal lines 222. In this way, the mechanical characteristics, such as the hardness, may be improved, as the hardness of some low-k materials may significantly increase upon treatment with, for instance, a laser beam. In some embodiments, the treatment of the dielectric layer 221 may be performed on substantially all exposed surface portions of the dielectric layer 221, thereby providing the potential for improving the overall stability of a metallization layer stack including low-k dielectric materials.

As previously explained with reference to FIGS. 1c-1e, the heating source, such as the source 151, for creating localized heating zones that are scanned along the length direction 225 may provide an irradiation beam, the absorption of which and thus whose efficiency of heat transfer may depend on beam characteristics such as wavelength, particle energy and the like. For example, the wavelength of a laser source may result in a moderately high reflectivity on metal, thereby reducing the efficiency of energy transfer from the beam to the metal. Thus, in some illustrative embodiments, a heat transfer layer may be formed prior to the directional heat treatment, wherein the characteristics of the heat transfer layer are selected so as to allow a moderately high energy deposition within the layer, thereby providing an enhanced heat transfer to the underlying metal.

Figure 2C:
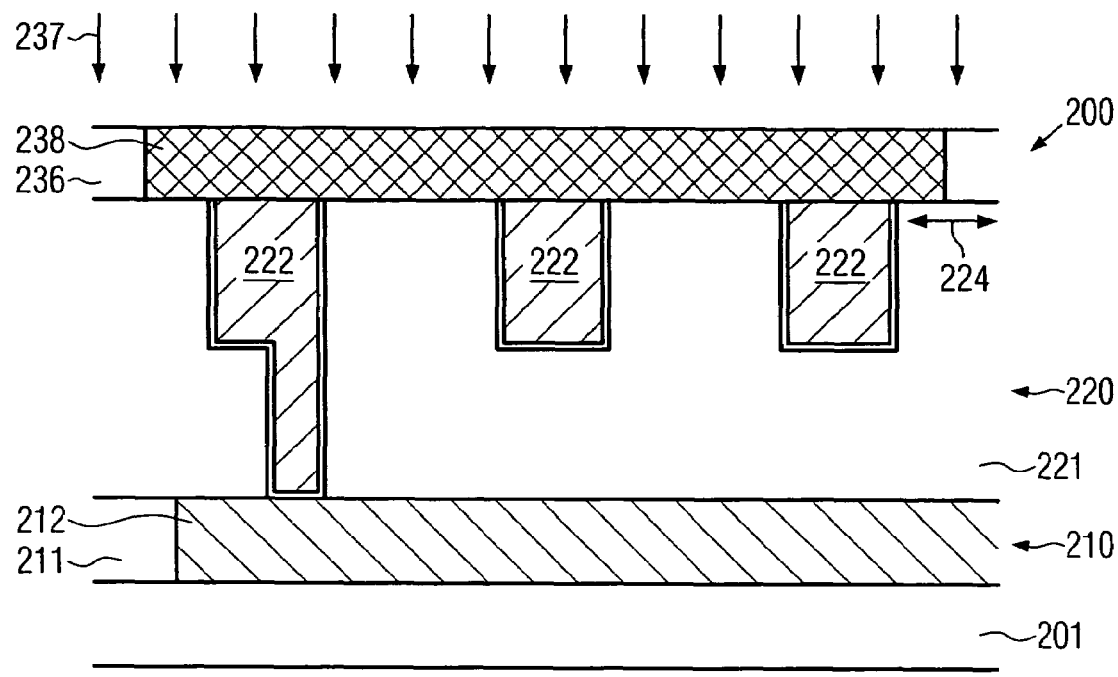

FIG. 2c schematically shows the device 200 after the above-described sequence for removing excess material of the layer 229 and after the formation of a heat transfer layer 236. The heat transfer layer 236 may be comprised of any appropriate dielectric material, such as a polymer material and the like, having characteristics so as to absorb a significant portion of a beam 237, which is designed to create a heating zone 238, which is locally restricted in the length direction 225, i.e., the direction perpendicular to the drawing plane of FIG. 2c, while in the lateral direction 224, the heating zone 238 may span over a plurality of metal lines 222. When the beam 237 is comprised of a laser beam of specified wavelength, the thickness and the extinction coefficient of the heat transfer layer 236 may be designed so as to absorb a high degree of radiation intensity. The heat transfer layer 236 may be formed in accordance with well-established deposition techniques, such as PECVD, spin-on techniques and the like. After the formation, the heat treatment on the basis of the beam 237 may be performed to modify the crystalline structure of the metal lines 222. In other embodiments, when heat is transferred via a heat transfer medium, as is described with reference to FIG. 1f, the provision of the heat transfer layer 236 may also be advantageous in that a direct contact of the heat transfer medium with the metal lines 222 is prevented. Consequently, a plurality of heat transfer medium, such as superheated water vapor, may be used without adversely affecting the metal lines 222.

Figure 2D:
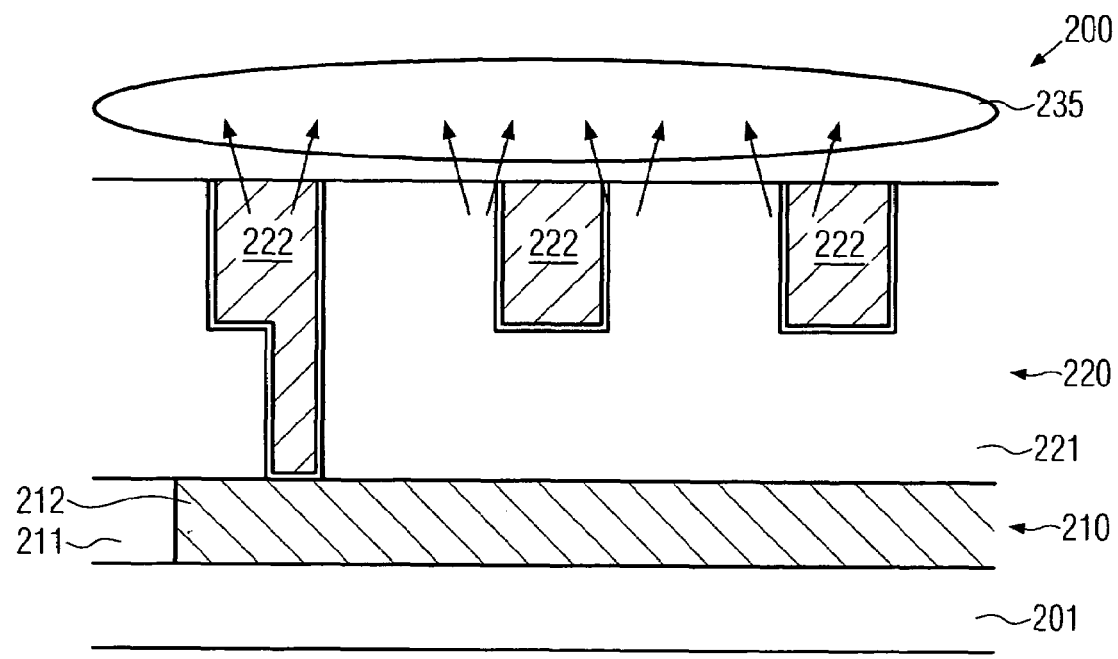

FIG. 2d schematically shows the device 200 after the removal of the heat transfer layer 236, which may be accomplished by any appropriate and well-established technique, such as isotropic etching, plasma etching and the like. During and after the removal of the heat transfer layer 236, the ambient 235 representing a sub-atmospheric ambient or a vacuum ambient may be established to promote the out-gassing of any contaminants that may have been incorporated during the electrochemical deposition and/or during the formation and removal of the heat transfer layer 236. Thereafter, in some embodiments, the ambient 235 may be modified to include a reducing atmosphere for further enhancing the purity of the metal lines 222.

As a result, the present invention provides a technique that enables the formation of metal lines of increased electrical performance characteristics in that the metal is provided with enhanced purity and/or the crystallinity of the metal is modified. The modification of the crystallinity may be performed on the basis of a heat treatment including the heating of a locally restricted zone, wherein the locally heated zone is scanned along a length direction of the metal line to reduce the number of grain boundaries in this direction. Moreover, the heat treatment with localized heating zones scanned along the length direction may effectively be combined with a heat treatment in a sub-atmospheric ambient, a vacuum ambient and a reducing ambient to promote out-gassing of any contaminants within the metal lines. In particular embodiments, a vacuum ambient may be established during a first phase of the heat treatment and a reducing ambient may be established in a second final phase of the heat treatment, wherein this heat treatment including at least these two ambients may be performed without a directional zone heating or may be combined with a directional zone heating. Hereby, the zone heating may be performed, at least partially, with the vacuum ambient being established and/or, at least partially, with the reducing ambient being established. As a consequence, the resistance against electro and stress migration and other stress-induced material transportation phenomena in metal lines may be improved, thereby also increasing the reliability of semiconductors including metallization layers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a metal line in a dielectric layer of a metallization layer of a semiconductor device, said metal line extending along a length direction; and
    performing a heat treatment to vary a temperature of the metal line along said length direction in a timely sequential manner such that energy is deposited at a rate that is selected so that a target temperature of a heated portion of the metal line is reached in a deposition time interval that is shorter than a time scale for heat transport in the metal line.

2. The method of claim 1, wherein forming said metal line comprises forming a trench in said dielectric layer and filling said trench with said metal.

3. The method of claim 2, wherein at least a portion of said metal is filled in by an electrochemical deposition technique with excess metal formed above said metal line and wherein said heat treatment is performed prior to removing said excess metal.

4. The method of claim 2, wherein filling in said metal comprises depositing at least a portion of said metal by an electrochemical deposition process and removing excess metal deposited during said electrochemical deposition process and wherein said heat treatment is performed after removing said excess metal.

5. The method of claim 1, wherein performing said heat treatment comprises directing a locally restricted beam of at least one of radiation and particles onto a first portion of said metal line and creating a relative motion between said locally restricted beam and said metal line along said length direction to irradiate a second portion adjacent to said first portion.

6. The method of claim 5, wherein said relative motion is a substantially continuous motion at a scan speed, and wherein at least one of the scan speed, a spot size of the locally restricted beam, and an overall intensity of the locally restricted beam are adjusted so that the energy of the locally restricted beam is deposited at a rate that is selected so that the target temperature of the heated portion of the metal line is reached in a deposition time interval that is shorter than the time scale for heat transport in the metal line.

7. The method of claim 5, wherein said locally restricted beam comprises a laser beam.

8. The method of claim 5, further comprising forming a heat transfer layer above said metal line prior to directing said locally restricted beam onto said metal line.

9. The method of claim 8, further comprising removing said heat transfer layer after said heat treatment.

10. The method of claim 9, wherein said metal line is exposed to one of a sub-atmospheric ambient and a vacuum ambient before or after removing said heat transfer layer to promote out-gassing of contaminants in said metal line.

11. The method of claim 1, farther comprising exposing said metal line to one of a sub-atmospheric ambient and a vacuum ambient to promote out-gassing of contaminants in said metal line.

12. The method of claim 11, wherein said heat treatment is performed while said metal line is exposed to said one of a sub-atmospheric ambient and a vacuum ambient.

13. The method of claim 11, farther comprising exposing said metal line to a reducing ambient after exposure to said one of a sub-atmospheric ambient and a vacuum ambient.

14. The method of claim 1, wherein said heat treatment is performed by directing a heat transfer medium in a locally restricted manner onto a portion of said metal line.

15. The method of claim 14, wherein said heat transfer medium comprises a heated inert gas.

16. The method of claim 14, wherein said heat transfer medium comprises a vapor having a condensation temperature that approximately corresponds to a target temperature of said heat treatment.

17. The method of claim 1, wherein said heat treatment comprises pre-heating said metal line and locally heating said metal line above a specified target temperature to heat said metal line along said length direction above said target temperature in a timely sequential manner.

18. The method of claim 2, wherein forming said metal line further comprises forming a seed layer on surfaces of said trench and electrochemically depositing one or more metals on said seed layer.

19. The method of claim 18, wherein said heat treatment comprises at least a first heating process for varying a temperature along the length direction of said metal line, said first heating process being performed after forming said seed layer and prior to completely depositing said one or more metals.

20. The method of claim 19, wherein said heat treatment comprises a second heating process varying a temperature along the length direction of said metal line, said second heating process being performed after completely depositing said one or more metals.

21. The method of claim 19, wherein said heat treatment comprises a second heating process after the deposition of the one or more metals, said second heating process being performed with a substantially uniform temperature along the length direction.

22. The method of claim 19, wherein said first heating process comprises scanning a locally restricted beam spot of a beam of at least one of radiation and particles along the length direction.

23. The method of claim 22, wherein said beam comprises a laser beam.

24. A method, comprising:
forming a metal line in a dielectric layer formed above a substrate comprising a semiconductor device;
performing a heat treatment to modify a crystalline structure of said metal line such that energy of the heat treatment is deposited at a rate that is selected so that a target temperature of a heated portion of the metal line is reached in a deposition time interval that is shorter than a time scale for heat transport in the metal line; and
exposing said metal line to a vacuum ambient to promote out-gassing of contaminants in said metal line.

25. The method of claim 24, further comprising exposing said metal line to a reducing ambient after exposure to said vacuum ambient.

26. The method of claim 24, wherein said heat treatment comprises a heating process designed to vary a temperature along a length direction of said metal line in a timely sequential manner using relative motion of a heat source and the metal line at a scan speed, and wherein at least one of the scan speed, a spot size of the heat source, and an overall intensity of the heat source are adjusted so that the energy of the heat source is deposited at a rate that is selected so that the target temperature of the heated portion of the metal line is reached in a deposition time interval that is shorter than the time scale for heat transport in the metal line.

27. The method of claim 24, wherein said metal line is formed by forming a trench in said dielectric layer and filling in one or more metals in said trench.

28. The method of claim 25, wherein said heat treatment is performed at least in part while said metal line is exposed to at least one of said vacuum ambient and said reducing ambient.

29. The method of claim 28, wherein said heat treatment comprises a heating process designed to vary a temperature along a length direction of said metal line in a timely sequential manner.

30. The method of claim 29, wherein said heating process is performed while said metal line is exposed to at least one of said vacuum ambient and said reducing ambient.

31. The method of claim 29, farther comprising forming a heat transfer layer prior to performing said heating process.

32. The method of claim 31, further comprising removing said heat transfer layer after said heating process while exposing said metal line to said vacuum ambient.

* * * * *

UNITED STATES PATENT AND TRADEMARK OFFICE
CERTIFICATE OF CORRECTION

| | |
|---|---|
| PATENT NO. | : 7,375,031 B2 |
| APPLICATION NO. | : 11/292537 |
| DATED | : May 20, 2008 |
| INVENTOR(S) | : Preusse et al. |

Page 1 of 1

It is certified that error appears in the above-identified patent and that said Letters Patent is hereby corrected as shown below:

In column 16, claim 11, line 46, delete "farther" and insert -- further --

In column 16, claim 13, line 53, delete "farther" and insert -- further --

Signed and Sealed this

Twenty-ninth Day of July, 2008

JON W. DUDAS
*Director of the United States Patent and Trademark Office*